United States Patent [19]
Goto

[11] Patent Number: 5,463,560
[45] Date of Patent: Oct. 31, 1995

[54] SEMICONDUCTOR INTEGRATED CIRCUIT DEVICE

[75] Inventor: Hiroyuki Goto, Tokyo, Japan

[73] Assignee: NEC Corporation, Tokyo, Japan

[21] Appl. No.: 952,690

[22] Filed: Sep. 28, 1992

[30] Foreign Application Priority Data

Sep. 27, 1991 [JP] Japan .................................... 3-248695

[51] Int. Cl.⁶ .................................................. H03K 19/08
[52] U.S. Cl. .......................... 364/489; 364/488; 326/101; 257/773
[58] Field of Search ..................... 364/488, 489, 364/490; 326/62, 101; 257/734, 773, 777

[56] References Cited

U.S. PATENT DOCUMENTS

| | | | |
|---|---|---|---|
| 4,459,496 | 7/1984 | Yamada et al. | 307/459 |
| 4,896,302 | 1/1990 | Sato et al. | 307/463 |
| 5,091,883 | 2/1992 | Matsuzaki et al. | 365/189.05 |

Primary Examiner—Vicent N. Trans
Attorney, Agent, or Firm—Sughrue, Mion, Zinn, Macpeak & Seas

[57] ABSTRACT

The IC according to this invention has a semiconductor chip which includes a first and a second pad lines consisting of a plurality of pads connected respectively to the corresponding plurality of terminals on two sides of a package corresponding to two sides of a mutually opposing first and second sides on a semiconductor substrate, a first and a second internal circuits formed respectively closer to the corresponding pad line in the space between the first and the second pad lines, for applying a predetermined processing to a transmitted data, a first and a second data bus connected respectively to these internal circuits for carrying out transmission of data for the corresponding internal circuit in bit parallel fashion, and wirings which connect these data bus to the plurality of pads.

Since this arrangement enables one to make the wiring length between each pad and the corresponding data pad uniform and short, the IC device according to this invention can reduce the transmission time of the data.

6 Claims, 2 Drawing Sheets

SEMICONDUCTOR INTEGRATED CIRCUIT DEVICE

BACKGROUND OF THE INVENTION

1. Field of the Invention

The present invention relates to a semiconductor integrated circuit device, and more particularly to a semiconductor integrated circuit device having a means for inputting/outputting in parallel a data with plurality of bits.

2. Description of the Prior Art

Packages for semiconductor integrated circuit devices include many types such as dual in-line package (referred to as DIP hereinafter), small out-line package (referred to as SOP hereinafter), small out-line J-lead (referred to as SOJ hereinafter), quad flat package (referred to as QFP hereinafter), pin grid array, and the like. However, packages of the type having a line (series) of terminals on the mutually opposing pair of sides (edges) such as DIP, SOP and SOJ (generically referred to as DIP hereinafter) are generally in use.

Data or address signals which are input/output to/from a semiconductor integrated circuit device (referred to as an IC hereinafter) such as a memory device and a microprocessor are ordinarily bit parallel signals having a plurality of bits (for example, 4, 8, 16 bits or the like). On the other hand, in an IC of DIP type package, terminals for inputting/outputting these bit parallel signals are needed also for connection to a control signal source and a power supply, so it is not possible to accommodate these signals by only a line of terminals on one of the pair of sides. Therefore, it is general to constitute the terminals for these bit parallel signals by both lines of terminals on the pair of sides.

On the other hand, on a semiconductor chip which is sealed in the interior of the package, there are formed pads in the vicinity of each terminal of the line of terminals along two sides that correspond respectively to the above-mentioned pair of sides, where these pads are respectively connected to the corresponding terminals by means of bonding wires.

When the above-mentioned semiconductor chip is a memory chip, there are formed on the surface of the chip a memory cell array part which carries out data read/write at a designated address in response to the bit parallel signal that is input/output through the plurality of terminals and pads, and a selection and data transfer control part which carries out the transfer of a bit parallel data to this designated address.

Similarly, when the above-mentioned semiconductor chip is a microprocessor, there are formed on the chip surface a data processing circuit which includes a data holding part which holds temporarily a bit parallel data itself that is input/output through the plurality of terminals and pads, an intermediate processed result and the final processed result of the data, and a data processing part which receives a data from the data holding part and returns it to the data holding part after applying a predetermined processing to the data, and a selection and data transfer control part which carries out data transfer control among the plurality of pads, the data holding part and the data processing part in response to the type of the data and the contents of the processing.

Since it is advantageous to arrange and form each of these circuits formed on the surface of the semiconductor chip collected as a block for each function, the memory cell array part, the data processing circuit, the selection and data transfer control part or the like are arranged and formed on the semiconductor chip as respective independent blocks without subdivision unless specifically needed to do so.

Namely, for the case memory chip, a plurality of pads are formed along the pair of sides, and the memory cell array part and the selection and data transfer control part are formed respectively in the region between the pair of lines of pads.

Similarly, for the case of microprocessor, the data processing circuit and the selection and data transfer control part are arranged and formed along the pair of sides in the region between the pair of lines of pads.

In the region on the semiconductor chip where the selection and data transfer control part is formed there are formed a plurality of data buses for performing data transfer in bit parallel fashion between the pair of lines of pads and the designated address, between the pair of lines of pads and the data holding part and the data holding part and the data processing part, and these data buses are connected respectively to the pads of the pair of lines of pads.

The selection and data transfer control part and the data buses formed in the above-mentioned manner on the semiconductor chip are necessarily deviated to one of the two lines of pads on the chip. Therefore, the wirings between the plurality of pads of one line of pads and the data bus become shorter than the wirings between the plurality of pads of the other line of pads and the data bus. Accordingly, the transmission time of either one of the data becomes longer due to the difference between the resistances and the wiring capacities of these wirings. Since the transmission time of a bit parallel signal is determined by the transmission time of a bit which requires the longest time of transmission among a plurality of parallel bits that constitute the signal, the data transfer time for the IC as a whole becomes long and its operating speed is reduced.

BRIEF SUMMARY OF THE INVENTION

OBJECT OF THE INVENTION

It is therefore the object of this invention to provide an IC which can reduce the transmission time within a semiconductor chip of a data that is input/output in bit parallel fashion.

SUMMARY OF THE INVENTION

The semiconductor chip of an IC according to this invention includes a first and a second lines of pads which are formed respectively in the vicinity of each of a mutually opposing pair of sides of a semiconductor substrate and consist of a plurality of pads which relay data in bit parallel, a first and a second internal circuits which are formed closer to each of the corresponding line of pads between the first and the second lines pads on the substrate and apply a predetermined processing to transmitted data, a first and a second data buses which are connected respectively to the corresponding internal circuits of the first and the second lines of pads and transmit data for the corresponding internal circuits in bit parallel, and wirings which correspondingly connect the first and the second data buses to the plurality of pads of the corresponding lines of pads.

Since the respective data buses are formed substantially parallel to the first and the second lines of pads that are formed along the mutually opposing sides, it is possible to reduce and uniformize the length of the wirings between the respective pads and the data buses, and hence reduce the transmission time of data that are transmitted through these pads.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
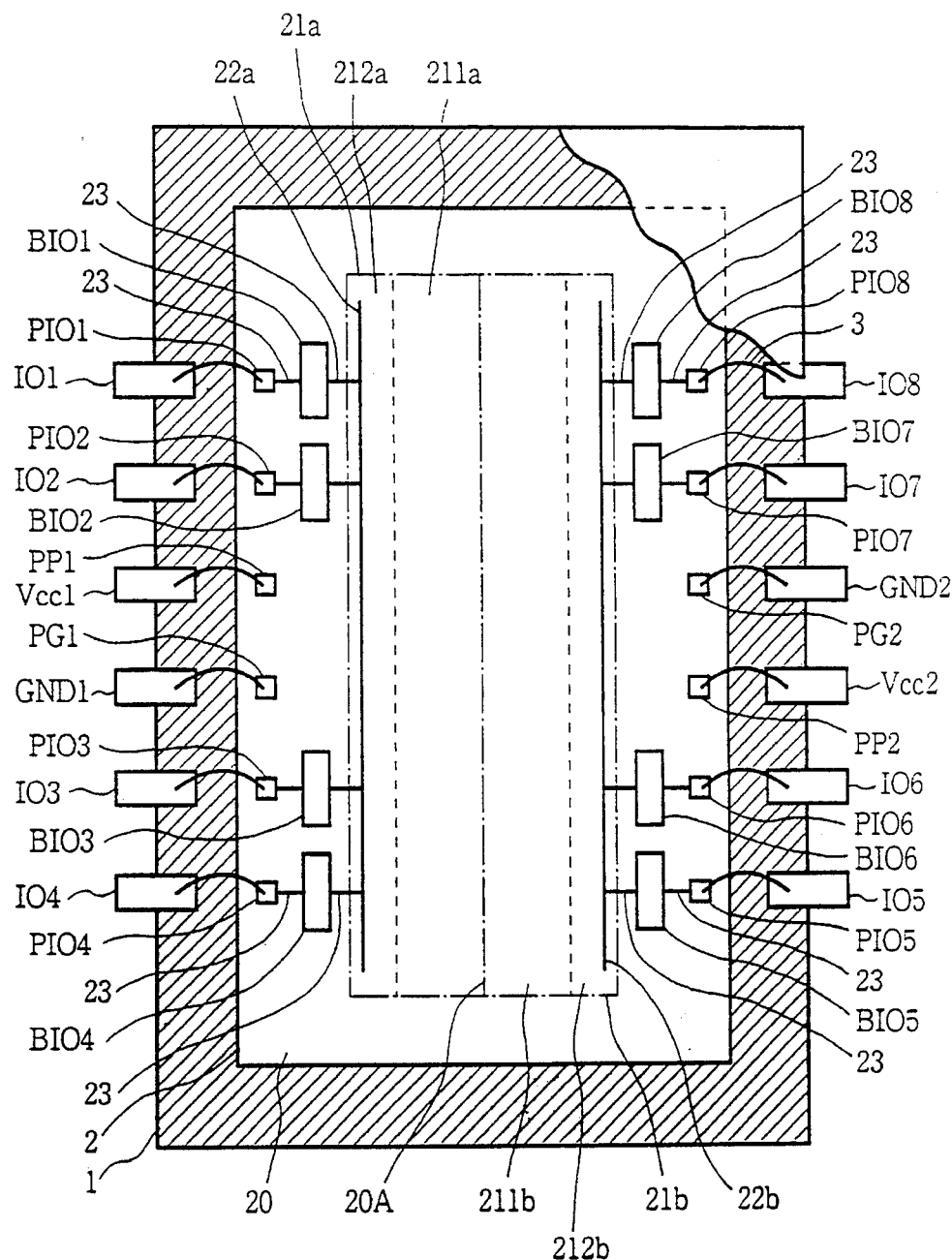
FIG. 1 is a partly broken plan view showing a first embodiment of this invention.

Referring to FIG. 1, the IC of a first embodiment of this invention includes a package 1 which has a plurality of data input/output terminals IO1–IO4 for carrying out data transfer in bit parallel with an external circuit and a power terminal $Vcc_1$ and a grounding terminal GND1 set in array on a first (left-hand) side, and data input/output terminals IO5–IO8 and a power terminal $V_{cc2}$ and a grounding terminal GND2 set in array on a second (right-hand) side which opposes the first side; a semiconductor chip 2 which includes internal circuit regions 21a/21b, data buses 22a/22b, data input/output pads (PIO1 to PIO4)/(PI05 to PI08), data buffer circuits (BIO1 to BIO4)/(BIO5 to BIO8) and wirings 23 that are formed in lateral symmetry on a semiconductor substrate 20 and housed within the package 1; and bonding wires 3 which correspondingly connect respectively the data input/output terminals IO1–I08 to the data input/output pads PIO1–PIO8, the power terminals $V_{cc1}$/$V_{cc2}$ to the power supply pads PP1/PP2, and the grounding terminals GND1/GND2 to the grounding pads PG1/PG2.

Describing the semiconductor chip 2 in more detail, this semiconductor chip 2 constituting a memory device includes: the internal circuit region 21a which includes a memory cell array part 211a formed on the left-hand side of and in the adjacent region to the center line 20A which is parallel to the left-hand and the right-hand edges of the substrate 20, and a column selection and data transfer circuit 212a on the outside region of the array part 211a; the data input/output pads PIO1–PI04, the power supply pad PP1 and the grounding pad PG1 formed respectively at locations corresponding to and most adjacent to the data input/output terminals IO1–IO4, the power terminal $V_{cc1}$ and the grounding terminal GND1 that are located in the region closest to the left-hand edge of the package 1; the data buffer circuits BIO1–BI04 that are formed in the region between the outer edge on the left-hand side of the column selection and data transfer circuit 212a and the data input/output pads PIO1–PI04; the data bus 22a formed along the outer edge on the left-hand side of the column selection and data transfer circuit 212a for transferring data in bit parallel between the data buffer circuits BIO1–BI04 and the column selection and data transfer circuit; and wirings 23 formed between the data buffer circuits BIO1–BI04, the data input/output pads PIO1–PI04 and the data bus 22a for connecting two members of these for every corresponding bit. It is to be noted that wirings 23 are formed between the power supply pad PP1 and the grounding pad GND1, and the memory cell array part 211a, the column selection and data transfer circuit part 212a and the data buffer circuits BIO1–BI04, but these wirings are not shown explicitly in FIG. 1. In addition, to the right of the center line 20A there are provided an internal circuit region 21b which includes a memory cell array part 211b and a column selection and data transfer circuit 212b, the data input/output pads PIO5–PIO8, a power supply pad PP2, a grounding pad PG2, the data buffer circuits BIO5–BIO8, a data bus 22b and the wirings 23, located symmetrically to the corresponding components on the left side with respect to the center line 20A.

Data supplied from an external circuit in bit parallel to the data input/output terminals (IO1 to IO4)/(IO5 to IO8) on the left/right side of the package 1 are transmitted respectively to the data bus 22a/22b on the left-/right-hand side through the data input/output pads (PIO1 to PIO4)/ (PI05 to PI08) and the data buffer circuits (BIO1 to BIO4)/ (BIO5 to BI08) formed in the proximity of the terminals. The column selection and data transfer circuit 212a/212b transfers the data transmitted to the data bus 22a/22b to a column of the memory cell array part 211a/211b selected in response to a column address signal (not indicated in FIG. 1). The memory cell array part 211a/211b writes the transferred data to the memory cell of a row selected in response to a row address (not indicated in FIG. 1) of the column. To read the stored data in the memory selected by a column address signal and a row address signal, an operation through the route opposite to the above is carried out.

In the conventional IC, the data input/output terminals and the data input/output pads are formed by arranging them divided to the left-hand side and the right-hand side of the package and the semiconductor chip as described above. In contrast, however, the internal circuits are formed by arranging them in blocks according to their functions. Namely, in the conventional IC corresponding to one shown in FIG. 1, only one each of the memory cell array part and the column selection and data transfer circuit, and correspondingly only one data bus, are formed on the semiconductor chip. In such a case, the column selection and data transfer circuit and the data bus belonging to this circuit are located in the semiconductor chip necessarily deviated either to the left-hand side or to the right-hand side. Accordingly, the lengths of the wirings between the data bus and the data input/output pads formed on the left-hand side and the right-hand side become non-uniform, and hence there are generated differences in the times of data transmission by the different wirings. Since the transmission time of a bit parallel signal is determined by the transmission time of a bit among the constituent bits which requires the largest transmission time as mentioned above, the data transmission time within the conventional IC becomes necessarily long.

In contrast, in the IC according to the first embodiment of this invention the column selection and data transfer circuit 212a/212b and the data bus 22a/22b are arranged in the proximity of each of the data input/output pads (PIO1 to PI04)/(PI05 to PI08) formed on the left-hand side or the right-hand side. Therefore, the distances between these pads and the data bus can be made uniform and short, and the data transmission time can be reduced.

Figure 2:
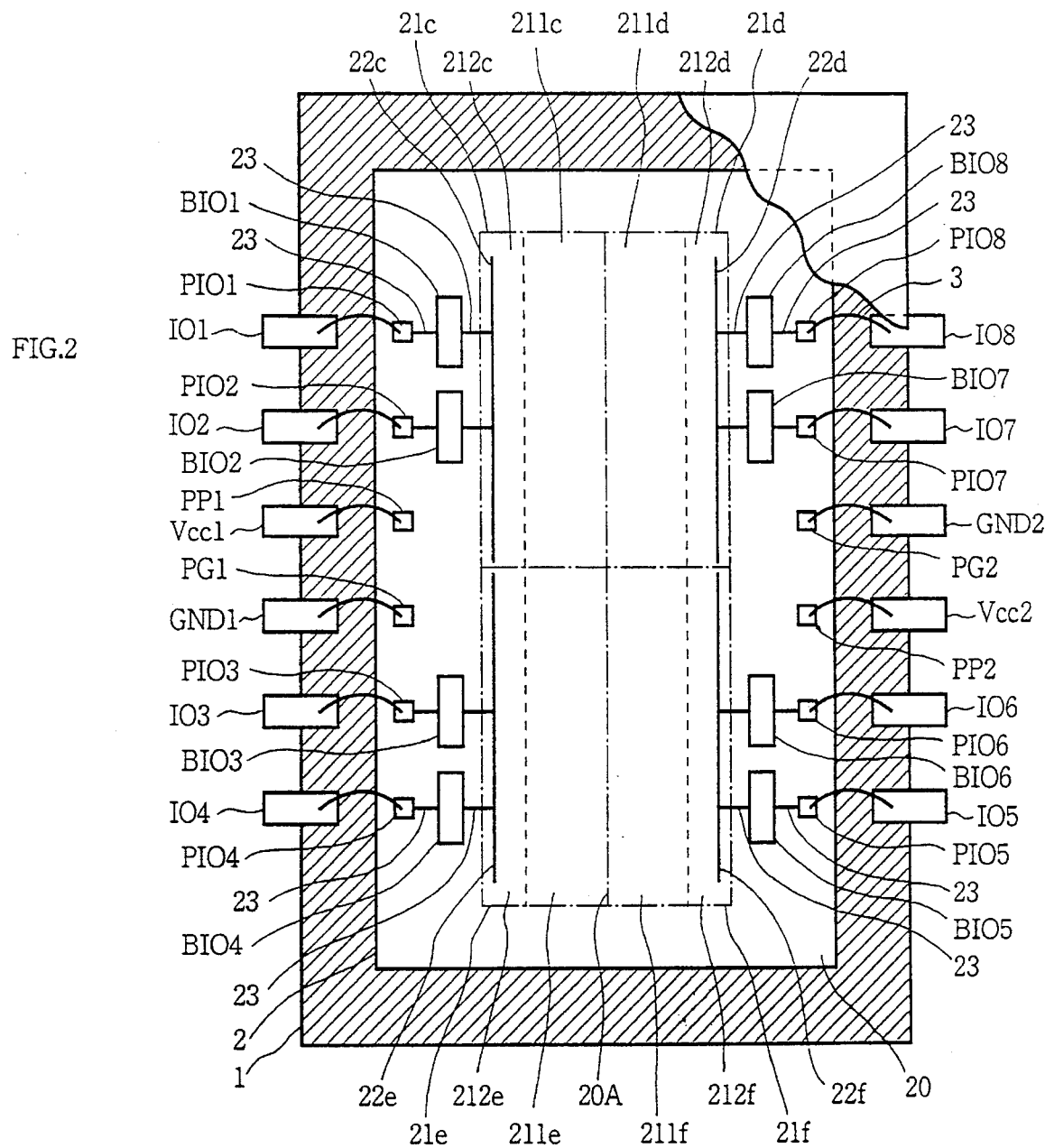
FIG. 2 is a partly broken plan view showing a second embodiment of this invention.

Referring to FIG. 2 in which identical reference numerals are assigned to the same components as in FIG. 1, the semiconductor chip 2a in the IC of the second embodiment of the invention has the following construction. Each of the data input/output pad lines PIO1 to PIO4 and PI05 to PIO8 on the left-hand side and the right-hand side of the substrate 20 is subdivided into two mutually adjacent short lines (in the embodiment in FIG. 2, into four short lines of data input/output pad pairs of PIO1 and PIO2/PIO3 and PIO4/ PI05 and PI06/PI07 and PI08), and an internal circuit region including a memory cell array part and a column selection and data transfer circuit, and a data bus (21c and 22c/21e and 22e/21f and 22f/21d and 22d) are arranged corresponding to each of these short lines. In addition, the data input/output buffer circuits BIO1 to BIO8 are similarly arranged corresponding to the respective short lines (BIO1 and BIO2/BIO3 and BIO4/BIO5 and BIO6/ BIO7 and BIO8). By the above-mentioned arrangement of the components, this embodiment carries out data write/ read in the unit of bit parallel code word corresponding to the above-mentioned short lines of the data input/output pads.

Since the lengths of the data buses 22c to 22f in this embodiment are shorter than the lengths of the data buses in the first embodiment, the data transmission time is further reduced.

In the two embodiments described in the above the configuration of the data input/output pads, the data buses, the internal circuit regions, and the like is laterally symmetric with respect to the center line. However, the configuration of these pads, circuits, and the like need not necessarily be arranged laterally symmetrically. For example, the pads, circuits, and the like may be arranged optimally by considering the connection positions for the control signal source and the power supply or the positional relationship with the peripheral circuit.

The technical concept of this invention as exemplified in the above two embodiments is also applicable to microprocessors without any change. In that case, the internal circuit corresponding to the internal circuit 21a/21b/21c/21d includes a data holding part for temporarily storing a data that is sent through the data bus, a data processing part for giving a predetermined processing to the data and outputting the result to the data bus, and a selection and data transfer control part which selectively carries out data transfer through the data bus among the data holding part, the data processing part and a plurality of input/output pads.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that appended claims will cover any modifications or embodiments as fall within the true scope of the invention.

I claim:

1. A semiconductor integrated circuit device for receiving a plurality of signals and performing a data processing operation in response to said signals, said device comprising;
   a semiconductor substrate of a rectangular shape defined by first and second edges opposite to each other and third and fourth edges opposite to each other;
   an internal circuit formed on said semiconductor substrate and performing said data processing operation, said internal circuit having a first side facing said first edge of said semiconductor substrate and a second side facing said second edge of said semiconductor substrate;
   a plurality of first pads provided for a first part of said signals to receive respective ones of said first part of said signals and formed on said semiconductor substrate between said first edge of said semiconductor substrate and said first side of said internal circuit;
   a plurality of second pads provided for a second part of said signals to receive respective ones of said second part of said signals and formed on said semiconductor substrate between said second edge of said semiconductor substrate and said second side of said internal circuit;
   a set of first bus lines formed along and parallel with said first side of said internal circuit;
   a set of second bus lines formed along and parallel with said second side of said internal circuit;
   first means provided between said first edge of said semiconductor substrate and said first side of said internal circuit for coupling each of said first pads to an associated one of said first bus lines; and
   second means provided between said second edge of said semiconductor substrate and said second side of said internal circuit for coupling each of said second pads to an associated one of said second bus lines; said internal circuit receiving said signals through said first and second pads and said first and second bus lines to perform said data processing operation in response to said signals.

2. The device as claimed in claim 1, wherein said first means for coupling comprises a plurality of first buffer circuits each receiving an associated one of said first part of said signals from an associated one of said first pads and transferring said associated one of said part of said signals to an associated one of said first bus lines, and said second means for coupling comprises a plurality of second buffer circuits each receiving an associated one of said second part of said signals from an associated one of said second pads and transferring said associated one of said second part of said signals to an associated one of said second bus lines.

3. A semiconductor integrated circuit device comprising:
   a semiconductor substrate having a first edge and a second edge opposite to said first edge;
   a memory circuit formed on said semiconductor substrate and having a first side facing said first edge of said semiconductor substrate and a second side facing said second edge of said semiconductor substrate;
   a plurality of first pads formed on said semiconductor substrate between said first edge of said semiconductor substrate and said first side of said memory circuit to receive a plurality of first data signals, respectively;
   a plurality of second pads formed on said semiconductor substrate between said second edge of said semiconductor substrate and said second side of said memory circuit to receive a plurality of second data signals, respectively;
   a set of first data lines provided along said first side of said memory circuit;
   a set of second data lines provided along said second side of said memory circuit;
   means provided between said first edge of said semiconductor substrate and said first side of said memory circuit for transferring each of said first data signals from an associated one of said first pads to an associated one of said first bus lines; and
   second means provided between said second edge of said semiconductor substrate and said second side of said memory circuit for transferring each of said second data signals from an associated one of said second pads to an associated one of said second data lines;
   said memory circuit further comprising a memory cell array including a plurality of memory cells and a control circuit for receiving said first and second data signals from said first and second data lines and for writing data corresponding respectively to said first and second data signals into a set of memory cells among said memory cells, respectively.

4. The device as claimed in claim 3, wherein said memory cell array is divided into first and second cell portions each including a plurality of ones of said memory cells and said control circuit is divided into first and second control portions provided respectively for said first and second cell portions, said set of memory cells comprising a first group of memory cells selected from the memory cells included in said first cell portion and a second group of memory cells selected from the memory cells included in said second cell portion, said first control portion receiving said first data signals and writing data corresponding respectively to said first data signals into said first group of memory cells, and said second control portion receiving said second data signals and writing data corresponding respectively to said second data signal into said second group of memory cells.

5. The device as claimed in claim 4, wherein said first control portion includes said first data lines and said second control portion includes said second data lines, said first and second cell portions being arranged between said first and second control portions.

6. The device as claimed in claim 5, wherein said first control portion further reads out first-stored-data from selected ones of the memory cells included in said first cell portion and transfers said first-stored-data to said first data lines, respectively, said second control portion further reads out second-stored-data from selected ones of the memory cells included in said second cell portion and transfers said second-stored-data to said second data lines, respectively, said first-stored-data being thereby supplied to said first pads, respectively, and said second-stored-data being thereby supplied to said second pads, respectively.

* * * * *